United States Patent [19]

Horna

[11] 4,377,793
[45] Mar. 22, 1983

[54] DIGITAL ADAPTIVE FINITE IMPULSE RESPONSE FILTER WITH LARGE NUMBER OF COEFFICIENTS

[75] Inventor: Otakar A. Horna, Bethesda, Md.

[73] Assignee: Communications Satellite Corporation, Washington, D.C.

[21] Appl. No.: 224,853

[22] Filed: Jan. 13, 1981

[51] Int. Cl.³ .................... H03H 17/04; H03H 21/00; H03H 15/02
[52] U.S. Cl. ..................................... 333/165; 333/166
[58] Field of Search ............................... 333/165, 166; 307/221 C, 221 D, 221 R; 328/167; 179/170.2; 364/724, 862

[56] References Cited

U.S. PATENT DOCUMENTS

| | | | |
|---|---|---|---|
| 3,639,848 | 2/1972 | Elliot | 328/167 |
| 3,980,873 | 9/1976 | Mattei | 364/724 |
| 4,204,177 | 5/1980 | Eggermont | 307/221 C |
| 4,283,696 | 8/1981 | Goser | 333/165 |

Primary Examiner—Marvin L. Nussbaum
Attorney, Agent, or Firm—Sughrue, Mion, Zinn, Macpeak and Seas

[57] ABSTRACT

A digital adaptive finite impulse response (AFIR) filter having a large number of coefficients is composed of two or more separate filter units. The first filter unit computes response samples $h_o$-$H_{n+1}$ in response to input signal samples to provide a partial estimated response during each sampling period. After the signal samples are fully processed by the first unit, they are transferred to a second filter unit which produces response samples $h_{n+2}$-$h_{p+1}$ in response thereto to provide a second partial response. The sum of the two partial responses is computed to provide the total estimated system response. The two independent filter units thus act simultaneously to provide twice as many coefficients as prior art AFIR filters in the same amount of time.

14 Claims, 7 Drawing Figures

DIGITAL ADAPTIVE FINITE IMPULSE RESPONSE FILTER WITH LARGE NUMBER OF COEFFICIENTS

BACKGROUND OF THE INVENTION

Digital adaptive transversal finite impulse response (AFIR) filters have recently become an important tool in signal processing. The theory of AFIR filters is described in "Identification Algorithm for Adaptive Filters", *Comsat Technical Review*, O. A. Horna, Volume 8, No. 2, Fall, 1978, pp 331-351.

Figure 1:
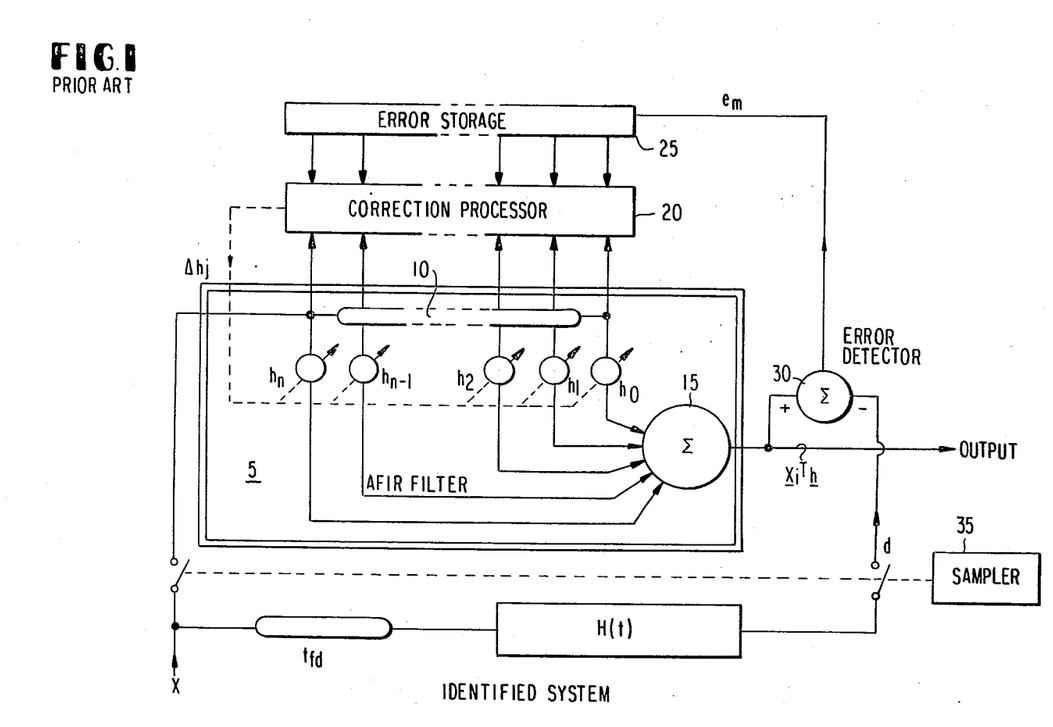
FIG. 1 is a block diagram of a prior art AFIR filter.

FIG. 1 is an illustration of one such filter. An input signal X is applied on the one hand to tap delay line 10 having a number of equi-distant taps, each of the taps equipped with an adjustable coefficient $h_j$. The input signal X is also applied to the echo feedback path through an identified system. The identified system includes a "flat delay" $t_{fd}$, and an impulse response $H(t)$. The signal X, as well as the system output d, are applied to the delay line 10 and the error detector 30, respectively, under the selective control of sampler 35.

The output $h_j$ of each of the adjustable amplitude devices, is applied to linear combiner 15 which sums the products $x_{ij}h_j$, where $x_{ij}$ are samples of the input signal X present at the ith sampling interval at the j-th tap, to produce the output $x_i^T h$. The identified system output d is subtracted from the system output from combiner 15 in error detector 30 to produce error signal $e_m$, which in turn is applied to error storage device 25. The errors $e_m$ are delivered from the error storage device 25 to correction processor 20. Correction processor 20 computes corrections $\Delta h_j$ which change the coefficients $h_j$ so as to drive the error value $e_m$ to zero. Thus, the output of the AFIR filter is as close a replica of the output of the identified system $H(t)+t_{fd}$ as possible.

The prior art device of FIG. 1 will work properly as long as the number of coefficients is relatively small (on the order of 10 or less) or if the samples of the input reference signal X are uncorrelated over time. Wideband white noise and Poisson waves are examples of a signal having this property. However, voice, music and video signals have autocorrelation coefficients of adjacent samples $\delta_{xx} > 0.8$ when sampled at the Nyquist rate. Thus, for "long filters" where the number of taps is greater than 30, decorrelation of the input signals entering the correction processor must be performed in order to permit the AFIR filter to converge to a stable state, i.e., a stable coefficient vector h.

Figure 2:
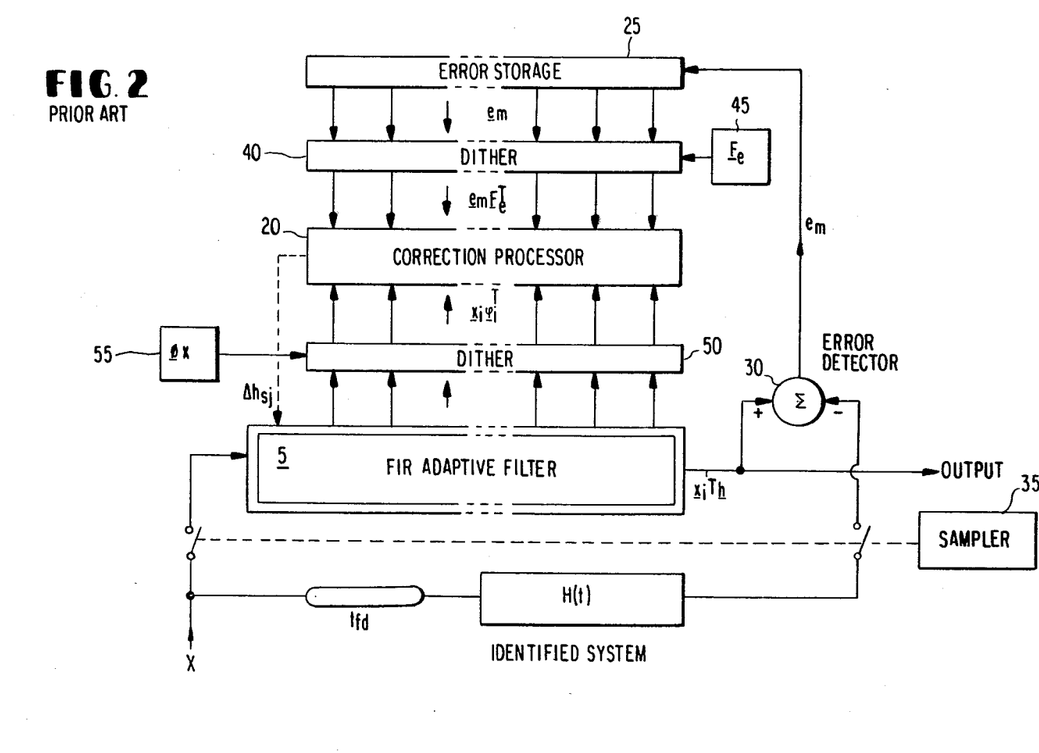
FIG. 2 is a block diagram of an improved version of the prior art AFIR filter.

A very effective prior art decorrelation technique is illustrated in FIG. 2. Both the error vector $e_m$ stored in the error storage register 25 and the signal vector $x_i$ stored in the AFIR filter 5 are multiplied or "dithered" by generators 45 and 55 which produce random sequences of ones and zeros $F_e$ and $\phi_x$, respectively, before entering the correction processor.

Although the number of taps in the filter may be increased and still provide the generation of a stable vector h for correlated signals, this decorrelation method substantially reduces the speed of the adaptation process for producing the coefficients $h_j$. Rather than multiplying the error and signal vectors by purely random sequences, a better solution exists in providing a pseudorandom dither which selects for processing only those samples $x_{ij}$ and $e_i$ greater than a predetermined value. Such a system is described in U.S. Pat. No. 4,064,379 to O. A. Horna.

Direct analog implementation of the AFIR filters of FIG. 1 or 2 is difficult. A wideband delay line with several milliseconds delay is difficult to implement electronically, and a direct electronic permanent or semi-permanent analog memory having the requisite precision does not yet exist. Therefore, typical AFIR filters, such as the one described in U.S. Pat. No. 4,064,379 typically use digital techniques.

Figure 3:
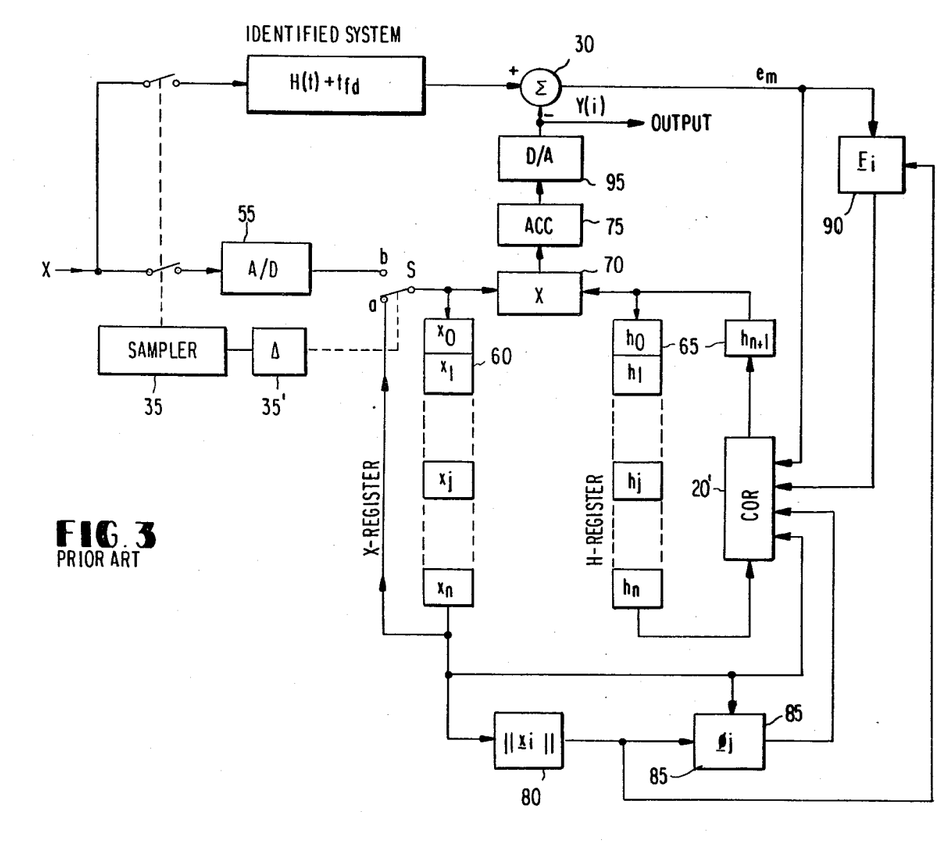
FIG. 3 is a block diagram of the digital embodiment of the AFIR filter of FIG. 2.

FIG. 3 is an illustration of a digital embodiment of a prior art AFIR filter. Input signal X is applied to the inputs of A to D converter 55 and the identified system under the selective control of sampler 35. The output of A to D converter 55 is selectively applied to X register 60 and multiplier 70 via switch S under the control of sampler 35 and delay device 35'. The delay device 35' provides an amount of delay equal to the analog-to-digital conversion time of converter 55. At all other times, switch S is in the "a" position to allow for the recirculation of the values $x_j$ in X register 60.

The output of X register 60 is applied to detector 80, pseudorandom sequence generator 85, and correction processor 20'. Detector 80 detects the square root of the sum of the squares of the contents of the X register. The output of detector 80 is applied on the one hand to pseudorandom generator means 85, and on the other hand to pseudorandom generator means 90. Pseudorandom generator means 90 receives a second input from the output of subtractor 30, and provides the pseudorandom sequence $F_i$ to correction processor 20'. The output of pseudorandom processor 85 provides the pseudorandom sequence $\phi_j$ to correction processor 20'. Correction processor 20' receives a further input directly from the output of subtractor 30. Finally, correction processor 20' receives its final input from the $h_n$ stage of H register 65. The present corrected coefficient value $h_{n+1}$ as calculated by correction processor 20' is delivered to the $h_{n+1}$ stage of H register 65, the value of which is applied to multiplier 70 on the one hand and recirculated to the first stage of H register 65, namely $h_o$, to provide the recirculation of the h vector.

Each of the stages of shift registers 60 and 65 actually comprises a multibit storage element, 8 bits for example, such that an 8-bit value in each of the storage elements is sequentially clocked to an adjacent storage element. Random access memories could be used as an alternative to shift registers 60 and 65 if so desired.

The output of the multiplier 70 is applied to accumulator 75 which functions accumulate the most recent $n+1$ products. The output of accumulator 75 is applied to D to A converter 95, which in turn provides the system output and an input to the negative terminal of subtractor 30.

The details of correction processor 20', and pseudorandom generators 85 and 90 are given in the above cited article in *Comsat Technical Review*, as well as in "Echo Canceller with Adaptive Transversal Filter Utilizing Pseudologarithmic Coding " by O. A. Horna, *Comsat Technical Review*, Volume 7, No. 2, Fall 1977, pp. 393-428, and from the above cited U.S. Pat. No. 4,064,379.

The X register 60, having $n+1$ stages, and the H register 65, having $n+2$ stages are clocked at a rate $(n+1)F_s$, where $F_s$ is the sampling rate of sampler 35, to thereby effect a convolution shift of the X and h vectors. However, the same convolution shift can be achieved using X and H registers having an equal number of stages by adding an additional clock pulse to the X register each sampling period. For each sampling period, the contents of registers 60 and 65 will have shifted n+1 stages. During the next clock pulse (n+2), the switch S is put in the "b" position under the control of sampler 35 and delay device 35', such that the next sample is placed in the X register. Since this occurs after n+2 shifts of the n+1 stage shift register, each sample effectively propagates through the registers one stage per each sampling period to thereby effectively provide the delay element 10, FIG. 1, while at the same time being circulated, multiplied and accumulated within each sampling period $1/F_s$ to effect the summation performed by element 15, FIG. 1. Thus, the sample Y(i) of the estimated response of the system $H(t)+t_{fd}$ is produced at the end of each cycle, where $$Y(i) = \sum_{j=0}^{n} x_{ij}h_j. \quad (1)$$

The contents of the last stage $x_n$ of shift register 60 are destroyed once per sampling period when switch S is in position "b" to accept the new sample.

Since the processing in the digital AFIR filter is serial, i.e., during one sampling period the partial products $x_{ij}h_j$ are computed sequentially and sequentially added into the accumulator, the sampling rate and the number of coefficients are limited by the speed of the shift registers and the speed of the multiplier and accumulator. With present digital circuits and with a sampling rate of 10 kHz, the maximum number of coefficients must typically be less than 300 to thereby provide a whole impulse response for the identified system of no longer than 30 milliseconds. While these values may be sufficient to handle the responses and delays in long distance telephone networks, they are insufficient to handle broadcast quality speech or systems having a long $t_{fd}$, such as acoustic feedback between microphone and loudspeaker in a public address system, or acoustic problems in teleconferencing, since $t_{fd}$, as well at the system response, must be stored by the h coefficients in register 65.

SUMMARY OF THE INVENTION

Thus, it is an object of the present invention to overcome the above mentioned shortcomings of the prior art AFIR filters.

In accordance with the present invention, the AFIR is composed of two or more separate units. The first unit stores response samples $h_o-h_{n+1}$ in the same way as the AFIR filter shown in FIG. 3. A partial estimated response is computed at the first unit during each sampling period. However, when a new sample is shifted into the X register, the oldest sample, rather than being destroyed, is read into a second shift register where samples $x_{n+1}-x_p$ are stored. The second unit also stores response samples $h_{n+2}-h_{p+1}$. During the same period, a second partial response is computed. The sum of the two partial responses is computed and subtracted from the sample of the response of the identified system to produce the error signal. Thus, the two independent units act simultaneously to thereby provide twice as many coefficients as the prior art system in the same amount of time.

Further, more than two of the independent units can be cascaded in this manner. Thus, the estimate of the response is the sum of the partial responses.

In accordance with the further aspect of the present invention, a detector detects a pseudo RMS or average value of the coefficients stored in the H register, and selectively clears the H register whenever the detected value indicates that either the impulse response of the AFIR filter has not been stored or that the H register contains a "false" or "contaminated" response. Resetting the response to zero permits a buildup of a new response under new signal conditions, and reduces the processing noise of the filter.

DETAILED DESCRIPTION OF THE INVENTION

Figure 4:
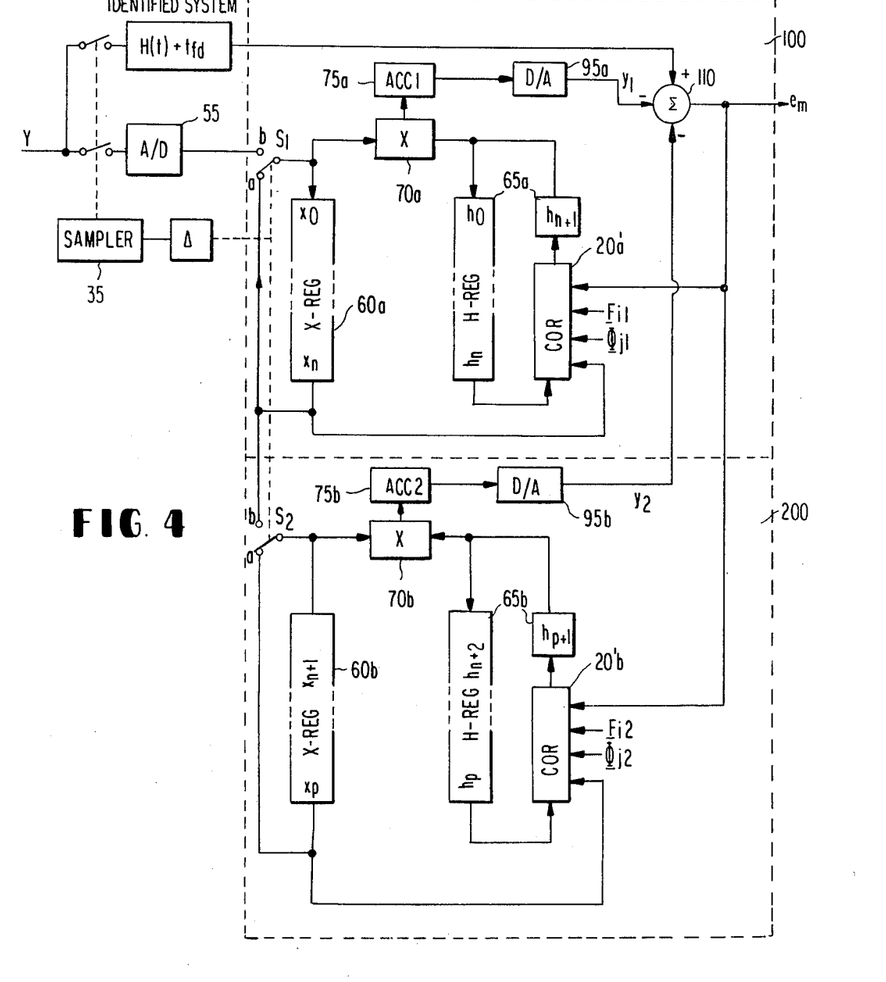
FIG. 4 is a block diagram of the AFIR filter in accordance with the present invention.

FIG. 4 is an illustration of the AFIR Filter in accordance with the present invention. Specifically, the filter of FIG. 4 is divided into first and second modular units 100 and 200, respectively. Each of the modular units 100 and 200 is substantially identical to the unit illustrated in FIG. 3, reference numerals in FIG. 4 identical to those of FIG. 3 identifying identical system elements. Pseudorandom generator means 80, 85 and 90 are not explicitly shown in FIG. 4, but may of course be included therein.

The two independent units 100 and 200 are connected as follows. The output of shift register 60a is applied on the one hand to the "a" terminal of switch S1, as in the FIG. 3 embodiment, but is also applied to the "b" terminal of switch S2, corresponding to the input switch S of FIG. 3. Thus, when the switch S1 is shifted to position "b" to shift a new sample into the shift register 60a, the oldest sample $x_n$ is not truncated, but rather is read into the second shift register 60b where the samples $x_{n+1}-x_p$ are stored.

Therefore, unit 100 stores samples $x_o-x_n$ in X register 60a, and $h_o-h_{n+1}$ in H register 65a, to thereby produce the first partial response $$Y_1(i) = \sum_{j=0}^{n} X_{ij}h_j \quad (2)$$

for each sampling period. Similarly, unit 200 stores samples $x_{n+1}-x_p$ in X register 60b, and response samples $h_{n+2}-h_{p+1}$ in H register 65b, to thereby produce the second partial estimated response $$Y_2(i) = \sum_{\substack{j=n+1,\\k=n+2}}^{p} X_{ij}h_k. \quad (3)$$

The two partial responses $Y_1$ and $Y_2$ are applied to subtractor 110 where they are subtracted from the output of the identified system to produce the error signal $e_m$ as before. As in the FIG. 3 embodiment, the error signal $e_m$ is returned to both correction processors $20'a$ and $20'b$ to thereby update the estimates.

It can now be seen that the number of coefficients $h_o - h_{p+1}$ has been doubled over that of the FIG. 3 embodiment, while each of the registers 60a, 60b, 65a, and 65b are clocked at the same rate as that in the FIG. 3 embodiment. Thus, twice as many coefficients may be provided in the FIG. 4 embodiment as in the FIG. 3 embodiment, while requiring the same amount of processing time.

Furthermore, more than two of the units 100 and 200 can be cascaded in a similar manner to thereby increase the total number of coefficients, while maintaining the overall processing time equal to the time required for any one unit to process samples. The estimate of the response for a system having m units is the sum of the partial responses $$Y(i) = \sum_{k=1}^{m} Y_k(i). \tag{4}$$

The sum $Y(i)$ may be computed in a subtractor similar to subtractor 110. The output of the subtractor is directly the difference between the estimated and true responses, namely the error $e_m$, and is used in the same manner as the filter shown in FIG. 3 to compute the corrections for all units.

Figure 5:
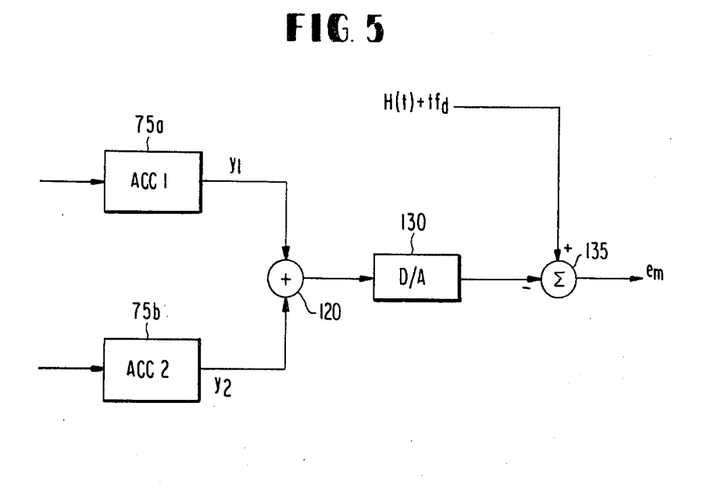
FIG. 5 is a block diagram of an alternate technique of combining the two partial responses produced by the embodiment of FIG. 4.

Rather than combining the output of the identified system with the partial responses $Y_1$ and $Y_2$ in subtractor 110 as shown in FIG. 4, the signals may be combined as illustrated in FIG. 5. Partial responses $Y_1$ and $Y_2$ from accumulators 75a and 75b, respectively, are digitally added in adder 120, and then converted to analog in a single D/A converter 130 for application to subtractor 135, to thereby reduce the required number of D/A converters.

Figure 6:
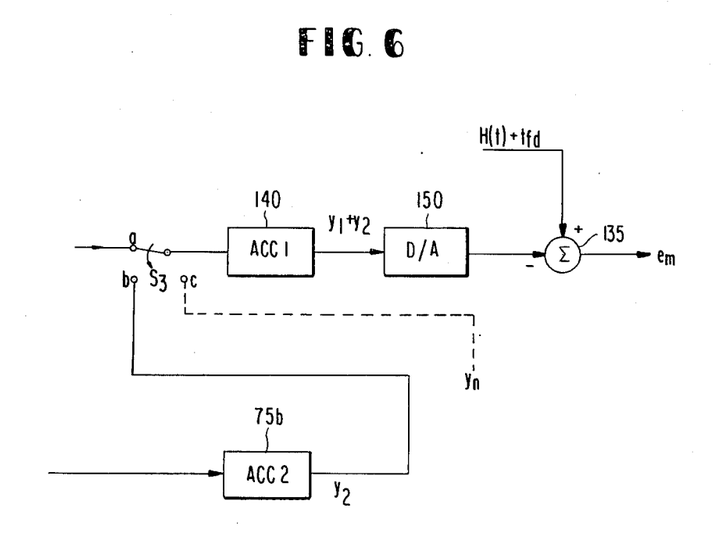
FIG. 6 is a preferred technique of combining the two partial responses produced by the filter of FIG. 4.

FIG. 6 illustrates a third and preferred technique for combining the partial responses $Y_1$ and $Y_2$. A switch S3 is provided for receiving the signal from the first multiplier 70a in the first unit 100 during the first convolution period (the inverse of the sampling frequency as determined in sampler 35). Before the start of the next convolution period, switch S3 is then connected to the output of the second accumulator 75b from the second unit 200, the contents of accumulator 75b being further added to accumulator 140. The contents of accumulator 140 at the end of the convolution period represents the sum of the partial responses $Y_1$ plus $Y_2$. The sum of the responses is applied to a single D to A converter 150 for further application to analog subtractor 135. It can be seen that the independent units can easily be cascaded using this arrangement by merely providing additional poles on switch S3, as illustrated by contact "c" receiving the partial value $Y_n$ of a further processing unit.

Figure 7:
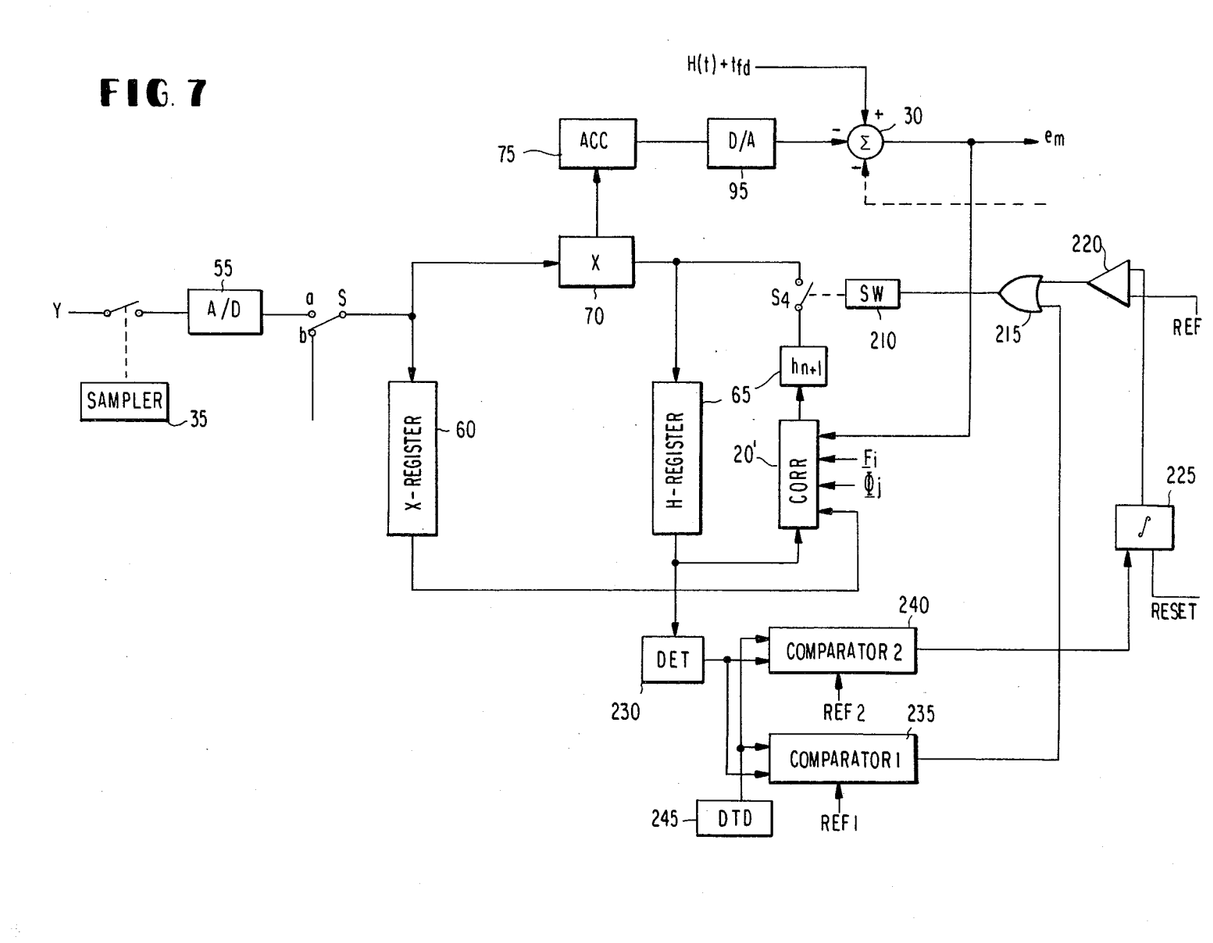
FIG. 7 is a block diagram of a technique for enhancing the performance of the AFIR filter in accordance with the present invention.

FIG. 7 illustrates a further aspect of the present invention. In most cases, the sampled impulse response stored in the H register 65 occupies only a small portion of the H register. Typically, the system impulse response can be stored using approximately 20 to 50 h coefficients. The other coefficients in H register 65 are therefore used to provide the delay $t_{fd}$. Thus, most of the coefficients $h_j$ have more or less random values close to zero. However, since even the coefficients produced to emulate the delay $t_{fd}$ are typically a non-zero number, they contribute to background or processing noise when multiplied by the stored signal samples, thereby increasing the error $e_m$. This is especially troublesome when a large number of coefficients are provided as in the present invention.

A second situation occurs when a strong, highly correlated interference signal outside the transmitted bandwidth can establish under certain conditions in the H register a "false" response which sometimes cannot be corrected by the correction algorithm used in the correction processor $20'$.

Both of these problems can be dealt with effectively if each of the sections 100 and 200 of the AFIR filter is equipped with the autocorrection device illustrated in FIG. 7. The output of the H register 65 is applied to a detector 230 which computes one of (i) RMS, (ii) average or (iii) normalized sum of the absolute values of each of the contents of H register 65. The detected value is then applied to comparators 235 and 240, where the detected level is compared to references 1 and 2, respectively. Comparator 235 detects the condition where the detected level from detector 230 is greater than the level of REF 1, to thereby indicate that the contents of the H register 65 have been "contaminated" by a "false" response which cannot be corrected in correction processor $20'$. In the event that such a level is detected in comparator 235, it delivers a signal to switch S4 via OR gate 215 and latch means 210. In this manner, switch S4 may be kept open for one full sample period of converter 55, whereby the entire contents of the H register 65 will be completely destroyed, thereby extinguishing the "false" response.

Comparator 240 detects the condition where the level detected in detector 230 is lower than a selected reference level, REF 2, to thereby indicate that the impulse response in this section of the AFIR filter has not been stored, and is not participating in the correction process. In this event, the random non-zero values in the H register 65, which contribute to background noise, are extinguished by opening switch S4 for an entire sampling period. However, the contents of the H register 65 will typically be at a value less than REF 2 during the normal adaptation period, unitl adaptation is achieved. Thus, integrator 225 and comparator 220 are further provided at the output of comparator 240 to ensure that the "low value" condition of H register 65 is maintained for an amount of time determined by integration time constant of the integrator 225 and the reference level of comparator 220. The output of the comparator 220 is applied to switch S4 through OR gate 215 and latch 210, such that in the event that comparator 220 detects that H register 65 has not achieved adaptation, and is merely adding background noise to the system, the contents of the H register can be set to zero.

The RMS, average, or average of absolute values of the coefficients stored in the H register 65 may be computed digitally or analogically in detector circuit 230. The choice of RMS, average, or average of absolute values, depends upon the nature of the transmitted signal X, e.g., voice, data, video, and upon the nature of the identified network, e.g., electric, electro-acoustic, and the like. For example, in good quality telephone transmission lines, the normalized sum of absolute values may be detected in detector 230. Comparator 235 would provide a signal to open switch S4 in the event that the normalized sum of the absolute values were greater than 5 percent of the maximum possible value, and comparator 240 would provide a signal to integrator network 225 in the event that the detected normalized sum of the absolute values were less than 0.1 percent of the maximum possible value. Integrator 225 and comparator 220 would pass the output from comparator 240 whenever the output of the comparator were less than the 0.1 percent value for at least several continuous seconds, e.g., 10 seconds. Integrator 225 would periodically be reset in order to avoid a buildup of comparator outputs.

As a further refinement, a double-talk detector 245, as fully discussed in U.S. Pat. No. 4,064,379, may provide a "double-talk" signal to comparators 235 and 240. In the event that a "double-talk" condition is detected by detector 245, comparator 240 should be disabled from providing an output to integrator 225, while the output of comparator 235 may, under certain circumstances and operating conditions, be stopped. Again, the exact technique of operating the system in accordance with the present invention will inevitably be a function of the system usage and conditions.

Thus, it can be seen that the present invention provides an arbitrary increase in the number of coefficients used in an AFIR filter, while at the same time maintaining a constant processing speed. The present invention is extremely flexible and lends itself to a wide field of applications. By simply cascading the independent modules to provide as many coefficients as desired, the AFIR filter can be used in long-distance telephone networks, broadcast quality speech systems, or to reduce acoustic feedback between microphone and loudspeaker in a public address system or in teleconferencing.

Various changes in the system described herein may be made within the scope and the spirit of this invention. The invention described herein is not limited to specific details, examples and preferred embodiments shown herein.

What is claimed is:

1. An adaptive multi-loop filter system for receiving (i) a signal input to a system to be characterized and (ii) a signal output from said system to be characterized for producing an estimated replica signal of said signal output, said filter system comprising:
    at least first and second filter units connected in cascade, each of said filter units comprising (i) receiving means receiving signal samples related to said signal input, each said receiving means includes first storage means having an input and an output, the output of said first storage means in said first filter unit being applied to the input of said first storage means in said second filter unit, (ii) characterizing means for characterizing the estimated partial impulse response of said system, the output of said first storage means also being applied to an input of said characterizing means, and (iii) means responsive to said receiving means and said characterizing means for producing an estimated partial replica signal,
    means for combining said estimated partial replica signals from said first and second filter units to form said estimated replica signal of said signal output,
    means for producing an error signal representative of the difference between the signal output of the system to be characterized and said estimated replica signal, and means for updating the value of said partial estimated impulse response signals as a function of said error signal and said signal samples related to said signal inputs.

2. The filter system of claim 1 wherein samples of said signal input are applied directly to said first storage means in said first filter unit.

3. The filter system of claim 2 wherein said first storage means comprises recirculating shift registers having outputs and inputs, said shift register in said first filter unit (i) intermittently receiving said signal samples at a first rate and (ii) all other times recirculating said shift register output to said shift register input at a second rate higher than said first rate.

4. The filter system of claim 3 wherein said shift register in said second filter unit (i) intermittently receives said output of said shift register in said first filter unit at said first rate and (ii) at all other times recirculates said shift register output to said shift register input at said second rate.

5. The filter system of claim 4 wherein said shift register in said first filter unit receives said signal samples at the same time said shift register in said second filter unit receives said output of said shift register in said first filter unit.

6. The filter system of claim 1 wherein said means for combining comprises first accumulator means, second accumulator means receiving said estimated partial replica signal from said second filter unit, and switch means for applying said estimated partial replica signal from said first filter unit to said first accumulator means during a first time interval and for applying an output of said second accumulator means to said first accumulator means during a second time interval subsequent to said first time interval.

7. The filter system of claim 1 wherein said means for combining comprises first and second accumulator means receiving said estimated partial replica signals from said first and second filter units, respectively, and adder means for adding the outputs of said first and second accumulators to produce said estimated replica signal.

8. The filter system of any one of claims 1 or 2-5 wherein said characterizing means comprises second storage means for storing a network function of said system to be characterized, and at least one of said first and second filter units further comprises:
    detecting means for detecting the value of the contents of said second storage means; and
    clearing means for selectively clearing said second storage means in accordance with said detected value.

9. The filter system of claim 8 wherein said clearing means comprises comparator means for comparing said detected value to a first reference value, said comparator means enabling said clearing means when said detected value is greater than said first reference value.

10. The filter system of claim 9 wherein said comparator means further comprises means for comparing said detected value to a second reference value, said comparator means enabling said clearing means when said detected value is lower than said second reference value over a predetermined period of time.

11. The filter system of claim 10 wherein said first reference value is larger than said second reference value.

12. The filter system of claim 11 wherein said detector means detects the average of the absolute values of all of said contents of said second storage means.

13. The filter system of claim 11 wherein said detector means detects the RMS value of the contents of said second storage means.

14. The filter system of claim 11 wherein said detector means detects the average of the contents of said storage means.

* * * * *